United States Patent
Oji et al.

[11] Patent Number: 5,939,140
[45] Date of Patent: *Aug. 17, 1999

[54] HOT FILAMENT CVD OF DIAMOND FILMS

[75] Inventors: Masataka Oji; Naoji Fujimori, both of Itami, Japan

[73] Assignee: Sumitomo Electric Industries, Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/489,638

[22] Filed: Jun. 12, 1995

[30] Foreign Application Priority Data

Jun. 13, 1994 [JP] Japan ................................. 6-130501

[51] Int. Cl.$^6$ .................................................. C23C 16/26
[52] U.S. Cl. ........................................... 427/249; 427/122
[58] Field of Search ............................ 428/408; 427/249, 427/122; 423/446

[56] References Cited

U.S. PATENT DOCUMENTS

| | | | |
|---|---|---|---|
| 5,071,708 | 12/1991 | Komaki et al. | 428/403 |
| 5,082,522 | 1/1992 | Purdes et al. | 257/77 |
| 5,127,983 | 7/1992 | Imai et al. | 423/446 |
| 5,144,380 | 9/1992 | Kimoto et al. | 257/77 |
| 5,183,530 | 2/1993 | Yamazaki | 156/643 |
| 5,209,812 | 5/1993 | Wu et al. | 156/613 |
| 5,250,149 | 10/1993 | Kimoto et al. | 423/446 |
| 5,254,862 | 10/1993 | Kalyankjumar et al. | 257/77 |
| 5,424,096 | 6/1995 | Anthony et al. | 427/249 |
| 5,523,121 | 6/1996 | Anthony et al. | 427/249 |

FOREIGN PATENT DOCUMENTS

| | | |
|---|---|---|
| 0493609 A1 | 7/1992 | European Pat. Off. . |
| 61-163273 | 7/1986 | Japan . |
| 62-202897 | 9/1987 | Japan . |
| 63-159292 | 7/1988 | Japan . |

OTHER PUBLICATIONS

Patent Abstracts of Japan, vol. 12, No. 414 (E–677) Nov. 2, 1988 & JP–A–63–153 815 (Fujitsu Ltd) Jun. 27, 1988, *abstract*.

Schwarzbach et al., "Internal Stresses In CVD Diamond Layers", Diamond And Related Materials, vol. 3, No. 4/6, Apr. 1994, Lausanne, CH, pp. 757–764.

HSU, "Mole Fractions Of H, $CH_3$, And Other Species During Filament–Assisted Diamond Growth", Applied Physics Letters, vol. 59, No. 12, Sep. 16, 1991, New York, pp. 1427–1429.

*Primary Examiner*—Roy V. King
*Attorney, Agent, or Firm*—Wenderoth, Lind & Ponack, L.L.P.

[57] ABSTRACT

An object of the invention is to provide a high quality synthetic diamond having a high bonding strength between a substrate surface and synthetic diamond or between synthetic diamond films. The object can be attained by a process for the synthesis of diamond comprising pre-heating mixed gases of a hydrocarbon and hydrogen by a heating body and feeding the heated mixed gases to a substrate surface heated to deposit diamond thereon, characterized by allowing the distance between the heating body and substrate surface to be apart from each other as far as possible in the carburizing step of the heating body and allowing the distance between the heating body and substrate surface to be nearer in the step of synthesizing diamond than in the former case.

4 Claims, 1 Drawing Sheet

HOT FILAMENT CVD OF DIAMOND FILMS

BACKGROUND OF THE INVENTION

1. Field of the Invention

This invention relates to an improvement in a gaseous phase synthesis process of diamond, synthesis apparatus for this process and synthetic diamond obtained by this process and more specifically, it is concerned with a high quality synthetic diamond with a high bonding strength between the synthetic diamond and a substrate surface, or between synthetic diamond films and with an excellent heat conductivity.

2. Description of the Prior Art

As a method for the production of diamond by a gaseous phase synthesis, a number of methods are known such as microwave plasma CVD methods, high frequency plasma CVD methods, DC plasma jet methods, etc., but as a method on commercial scale, thermal filament CVD methods excellent in mass-productivity and feasible with a low cost installation have commonly been employed.

The thermal filament CVD method is a synthetic method for obtaining a diamond film, comprising subjecting mixed gases of a hydrocarbon and hydrogen to thermal cracking by thermoelectron emission of a heating body heated at 1000° C. or higher and then depositing it on a substrate surface heated at 500 to 1300° C.

In a filament CVD method of the prior art, diamond has been synthesized by the following steps:

(1) placing a heating body and substrate with an interval therebetween suitable for the synthesis of diamond,
(2) introducing mixed gases of a hydrocarbon and hydrogen and gradually heating the heating body and
(3) when the temperature of the heating body reaches a temperature suitable for the synthesis of diamond, maintaining the heating body at a constant temperature and synthesizing diamond on the substrate.

The filament CVD method has a problem of metallic contamination of the synthetic diamond because of using, in general, a high melting point metal such as W, Ta, Re, etc. as a heating body. Since the heating body is covered with carbon atoms as a raw material at a certain temperature and the surface of the heating element is protected by the so-called carburization treatment, the metallic contamination of the synthetic diamond is decreased, but the metallic contamination in the step of heating the heating body until the surface of the heating body is completely covered by this carburization treatment has become an important problem.

That is, the substrate surface or previously synthesized diamond surface is coated with the metal and stripping of the diamond film during or after the synthesis sometimes takes place due to low bonding strength of the metallic coating. Furthermore, the heat conductivity is lowered to deteriorate the property as a heat radiation substrate because of the presence of the metallic coating part in the synthetic diamond film.

SUMMARY OF THE INVENTION

It is an object of the present invention to provide a high quality synthetic diamond with a high bonding strength between the synthetic diamond and a substrate surface, or between synthetic diamond films and with an excellent heat conductivity, whereby the above described problems can be solved.

It is another object of the present invention to provide a process for the gaseous phase synthesis of diamond by preventing a substrate surface from adhesion of a metal.

These objects can be attained by a process for the gaseous phase synthesis of diamond comprising pre-heating mixed gases of a hydrocarbon and hydrogen by a heating body heated and feeding the mixed gases to a substrate surface heated to deposit diamond thereon, characterized by allowing the distance between the heating body and substrate surface to be apart from each other as far as possible in the carburizing step of the heating body, and allowing the distance between the heating body and substrate surface to be nearer in the step of synthesizing diamond than in the former case.

BRIEF DESCRIPTION OF THE DRAWINGS

The accompanying drawings illustrate the principle and merits of the present invention in detail.

DETAILED DESCRIPTION OF THE INVENTION

Figure 1:
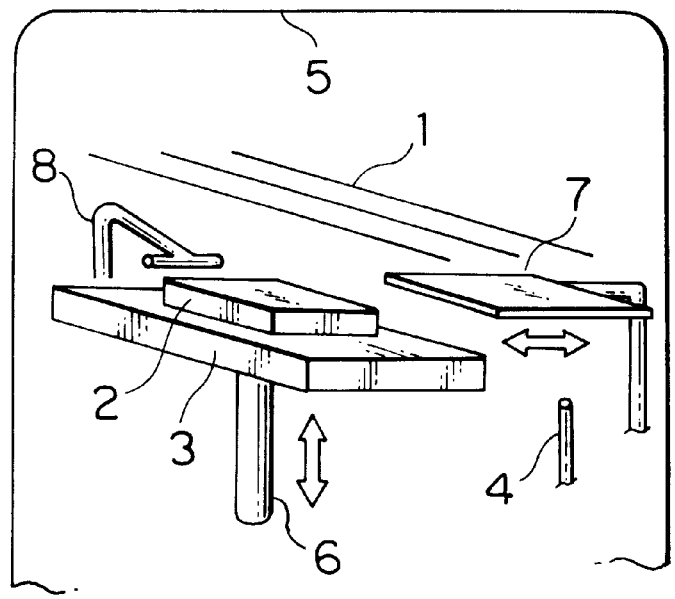
FIG. 1 is a schematic view of one embodiment of the apparatus for the synthesis of diamond used in the present invention.

In the carburizing treatment of a heating body, it is required to make an atmosphere such that a metal from the heating element does not adhere to the surface of a substrate. To this end, the following means are effective:

(1) In the step of raising the temperature of a heating body, the heating body and substrate surface are allowed to be apart from each other as far as possible so as to prevent adhesion of the metal of the heating body to the substrate.
(2) In the step of raising the temperature of a heating body, a shielding substance is provided between a heating body and substrate surface to protect a substrate surface from contamination of the metal of the heating body.
(3) In the step of raising the temperature of a heating body, a high speed gas is allowed to flow over a substrate surface or between a heating body and substrate surface to form a so-called curtain of a gas flow.
(4) The surface of a heating body is protected by a carburization treatment while maintaining the temperature of the heating body as low as possible.

On the other hand, in the step of synthesizing diamond, it is naturally required to release the above described means and synthesize diamond under conditions suitable for synthesizing diamond. In the step of raising the temperature of the heating body in the step of synthesizing diamond after the carburization treatment, little metallic contamination takes place because the surface of the heating body has already been carburized. If the step of synthesizing diamond is successively carried out after the step of the carburization treatment, the steps can be shortened.

Accordingly, it is preferable to synthesize diamond by carrying out the carburization treatment using at least one means from the above described means (1) to (4), releasing the above described means by an exterior operation, setting up diamond synthesis conditions and then synthesizing diamond by means of a synthesis apparatus of diamond.

In the above described means (1), the carburization treatment of the heating body is generally carried out by allowing the distance between the heating body and substrate surface to be at least 50 mm, preferably at least 200 mm and the synthesis of diamond is generally carried out by allowing the distance between the heating body and substrate to be at most 50 mm, preferably 4 to 20 mm.

In the above described means (2), it is preferable to use a shielding plate consisting of at least one member selected from metals excellent in high temperature strength such as Mo, W, etc. or alloys thereof as a shield between the heating body and substrate surface.

In the above described means (3), there are used gases such as $H_2$, $N_2$, Ar, etc. as the high speed gas to be allowed to flow over the substrate surface or between the heating body and substrate surface, the flow rate being at least 5 cm/sec, preferably at least 20 cm/sec.

In the above described means (4), the temperature of the heating body in the step of the carburization treatment is lower than 2000° C., preferably 1500 to 2000° C.

In the present invention, in general, it is preferable to use a tungsten filament as the heating body and an Si substrate as the substrate, but any materials can be chosen which have commonly been used in the methods of this kind. Generally, in the step of synthesizing diamond, the temperature of the heating body is adjusted to at least 2000° C., preferably 2100 to 2400° C., and the temperature of the substrate surface is adjusted to normal temperature to 1000° C.

In the present invention, to the raw material gas can be added at least one of oxygen-containing gases such as $CO_2$, CO, $O_2$, $H_2O$, NO, $NO_2$, etc. to decrease hydrogen gas in the synthesized diamond. Furthermore, an inert gas such as $H_2$, Ar, He, etc. can be added thereto to control the stress in the synthesized diamond by the CVD method.

According to the diamond synthesis of the present invention, the following merits or advantages can be given:

Stripping of a diamond film due to stress can be decreased since the step of the carburization treatment is carried out by at least one of the above described means (1) to (4) and the synthesized diamond film meets with less metallic contamination at an interface between the substrate surface and diamond film.

In synthetic diamond films obtained by repeating at least two times the step of the carburization treatment by the use of at least one of the above described means (1) to (4) and the step of synthesizing diamond, metallic contamination is also decreased in the interface between the diamond films to such a great extent that the interface of the diamond films is not stripped, the heat conductivity is not lowered and the high heat conductivity diamond intrinsically has can be achieved.

Metallic contamination of the synthesized diamond film somewhat occurs and even in the case of the above described means, in particular, the interface is subject to metallic contamination to a much greater extent than parts other than the interface, thus forming a thin metallic film sometimes. In the synthetic diamond obtained by the repeated synthesis as such, if a film formed of other materials than diamond component has a thin thickness to such an extent that the whole surface of the diamond film is not completely covered, a newly synthesized diamond film thereon takes over the diamond crystal grains below it and can be freed from lowering of the heat conductivity. When the concentration of other components than diamond component in the interfacial part of the repeated synthesis is very small and this zone occupies a small proportion to the whole of the synthesized diamond film, lowering of the heat conductivity to a large extent can be avoided.

In this case, it is preferable that a zone formed of other materials than diamond is not present or if any, there is only a zone which is not uniform nor thick to such an extent that it covers completely the whole surface or which does not have a structure of separating crystal grains of the whole surface. In the synthetic diamond as described above, the concentration of other components than diamond component, formed of at least one member selected from the group consisting of Group 4A, 5A, 6A and 7A metals of the Periodic Table or carbides thereof, is at most 1/100 (atomic ratio) in the whole diamond film.

Preferred embodiments of the present invention are summarized below:

(1) The distance between the heating body and substrate surface is at least 50 mm in the carburizing step of the heating body, and the distance between the heating body and substrate surface is at most 50 mm in the step of synthesizing diamond.

(2) The shielding substance is a shielding plate consisting of a metal excellent in high temperature strength, such as Mo, W, etc. or an alloy thereof.

(3) The high speed gas flow has a flow rate of at least 5 cm/sec, preferably 20 cm/sec.

(4) The high speed gas flow consists of a gas selected from the group consisting of $H_2$, $N_2$ and Ar.

(5) The temperature of the heating body in the step of the carburization treatment is lower than 2000° C., preferably 1500 to lower than 2000° C. and the temperature of the heating body in the step of synthesizing diamond is at least 2000° C., preferably 2100 to 2400° C.

(6) A combination of two or more of the above processes may be carried out as an indispensable element.

(7) A combination of two or more process features in the above described (1) to (6) may be carried out as an indispensable element.

EXAMPLES

The present invention will now be illustrated by Examples wherein diamond was synthesized by the use of a synthesis apparatus in accordance with the above described processes, and by Comparative Examples wherein diamond was synthesized by the prior art process.

FIG. 1 is a schematic view of a synthetic apparatus to conduct the processes (1) to (7) described above, comprising a heating body 1, substrate 2, substrate-supporting base 3, raw material gas feeding nozzle 4, reactor 5, vertically moving shaft 6 having an ascending and descending mechanism of the substrate-supporting base, Mo shielding plate 7 having a left and right moving mechanism and high speed gas flow nozzle 8.

Example 1

In an apparatus for the synthesis of diamond shown in FIG. 1, a synthetic experiment was carried out in which a distance between the heating body and substrate surface was changed in the carburization treatment step of the heating body and diamond synthesis step.

The heating body 1 was made up of three tungsten filaments (length: 250 mm, diameter: 0.5 mm) stretched at an interval of 6 mm and an Si substrate of 10 mm square was used as the substrate 2.

In the carburization treatment step of the heating body, the distance between the heating body and substrate surface was adjusted to 100 mm and in the diamond synthesis step, the distance between the heating body and substrate surface was adjusted to 6 mm. In the carburization treatment step of the heating body, the distance between the heating body and substrate surface was first adjusted to 100 mm, $H_2$ at 1000 cc/min and $CH_4$ at 20 cc/min were then introduced from the raw material gas feeding nozzle 4, while maintaining the inside of the reactor 5 at 100 Torr, electric current was applied to the heating body 1 to heat the heating body up to 1900° C. and maintained for 1 hour, during which the temperature of the substrate surface was maintained at lower than 150° C. The heating body was carburized and after 1 hour, the surface of the heating body was covered with carbon and tungsten carbide.

After the carburization treatment step, the substrate-supporting base 3 was moved upward by the vertically moving shaft 6 to adjust the distance between the heating body and substrate surface to 6 mm and the temperature of the heating body was subsequently raised to 2200° C., followed by maintaining it for 40 hours.

During the diamond synthesis step, the temperature of the substrate surface was maintained at 750 to 800° C. The carburization treatment step of the heating body and diamond synthesis step, as described above, were repeated three times under the same conditions to obtain a synthetic diamond film of 180 $\mu$m in thickness on the substrate. The synthesized diamond film was not stripped, and interfaces between the substrate and diamond film and between the diamond films were present, but it was found by observation using an electron microscope that the thickness of metallic impurity film partially present in the interface was at most 1 $\mu$m and diamond crystal grains were substantially continuous even in the interface. It was made clear as a result of elemental analysis that this metallic impurity film was formed of tungsten, as the material of the heating body, but the tungsten concentration was very small and was assumed to be a concentration of at most 1/200 (atomic ratio) to the whole of diamond. Furthermore, the substrate was dissolved, the surface of the synthesized diamond was polished and the heat conductivity in the synthesis direction was then measured to obtain 10 W/cm·K.

Example 2

In an apparatus for the synthesis of diamond shown in FIG. 1, a synthetic experiment was carried out in which a distance between the heating body and substrate surface was changed in the carburization treatment step of the heating body and diamond synthesis step and moreover, a shielding plate of Mo was placed between the heating body and substrate surface in the carburization treatment step of the heating body, the shielding plate of Mo was moved and diamond was then synthesized.

Synthesis of diamond was carried out under the same conditions as in Example 1 except placing, during the step of carburization treatment of the heating body, the shielding plate 7 of Mo between the heating body and substrate surface and below the heating body by 80 mm, as shown in FIG. 1, and after the carburization treatment of the heating body, moving the shielding plate of Mo to the right, withdrawing it from the space over the substrate and then adjusting the distance between the heating body and substrate surface to 6 mm.

Stripping of the resulting synthetic diamond film was not found and the interfaces between the substrate and diamond film and between diamond films were found to such an extent that they were hardly observed by an electron microscope. The substrate was dissolved, the surface of the synthesized diamond was polished and the heat conductivity in the synthesis direction was then measured to obtain 13 W/cm·K.

Example 3

In an apparatus for the synthesis of diamond shown in FIG. 1, a synthetic experiment was carried out in which a distance between the heating body and substrate surface was changed in the carburization treatment step of the heating body and diamond synthesis step and moreover, $H_2$ gas was allowed to flow at a rate of 5000 cc/min between the heating body and substrate surface, mainly toward the substrate surface, from the high speed gas feeding nozzle in the carburization treatment step of the heating body, the high speed gas flow was stopped and diamond was then synthesized.

Synthesis of diamond was carried out under the same conditions as in Example 1 except allowing $H_2$ gas to flow at a rate of 5000 cc/min and flow rate of 15 cm/sec toward the substrate surface from the high speed gas flow nozzle 8 shown in FIG. 1 during the step of carburization treatment of the heating body, and after the carburization treatment of the heating body, stopping the high speed gas flow and then adjusting the distance between the heating body and substrate surface to 6 mm.

Stripping of the resulting synthetic diamond film was not found and the interfaces between the substrate and diamond film and between diamond films were found to such an extent that they were hardly observed by an electron microscope. The substrate was dissolved, the surface of the synthesized diamond was polished and the heat conductivity in the synthesis direction was then measured to obtain 12 W/cm·K.

Example 4

In an apparatus for the synthesis of diamond shown in FIG. 1, a synthetic experiment was carried out in which a distance between the heating body and substrate surface was changed in the carburization treatment step of the heating body and diamond synthesis step, moreover, the temperature of the heating body was maintained relatively low in the carburization treatment step of the heating body and after the carburization treatment, the temperature of the heating body was raised to a temperature suitable for the synthesis and diamond was then synthesized.

Synthesis of diamond was carried out under the same conditions as in Example 1 except adjusting the temperature of heating body to 1800° C. in the step of carburization treatment of the heating body.

Stripping of the resulting synthetic diamond film was not found and the interfaces between the substrate and diamond film and between diamond films were found, but it was assumed by observation using electron microscope that the metallic impurity film partially present in the interface had a film thickness of at most 1 $\mu$m and crystal grains were substantially continuous even in the interface. Furthermore, the substrate was dissolved, the surface of the synthesized diamond film was polished and the heat conductivity in the synthesis direction was then measured to obtain 12 W/cm·K.

Comparative Examples

Figure 2:
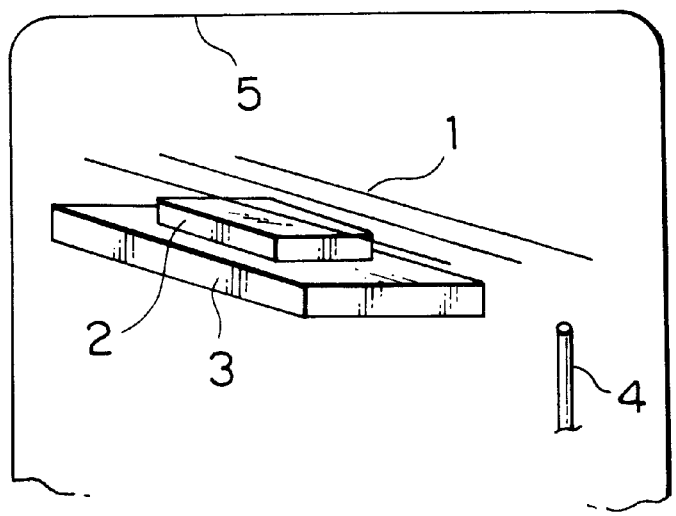
FIG. 2 is a schematic view of another embodiment of the apparatus for the synthesis of diamond used in a Comparative Example.

FIG. 2 is a schematic view of an apparatus for the synthesis of diamond, comprising a heating body 1, substrate 2, substrate-supporting base 3, raw material gas feeding nozzle 4 and reactor 5, the distance between the heating body and substrate surface being adjusted to 6 mm.

Comparative Example 1

In an apparatus for the synthesis of diamond shown in FIG. 2, a synthetic experiment was carried out under the following conditions:

The heating body 1 was made up of three tungsten filaments (length: 250 mm, diameter: 0.5 mm) stretched at an interval of 6 mm and an Si substrate of 10 mm square was used as the substrate 2.

In both of the carburization treatment step and synthesis step, the distance between the heating body and substrate surface was adjusted to a constant value, i.e. 6 mm. $H_2$ at 1000 cc/min and $CH_4$ at 20 cc/min were then introduced from the raw material gas feeding nozzle 4, while maintaining the inside of the reactor 5 at 100 Torr, electric current was applied to the heating body 1 to heat the heating body up to 2100° C. and maintained for 1 hour.

The temperature of the substrate surface was already 600° C. in this carburization treatment step. Subsequently, the temperature of the heating body was raised to 2200° C. and maintained for 40 hours. In this diamond synthesis step, the temperature of the substrate surface was maintained at 750 to 800° C.

The above described steps were repeated three times under the same conditions. After the second synthesis, the synthesized diamond film was somewhat stripped and when the third synthesis step was held for 15 hours, the synthesized diamond film was completely stripped. A clear deteriorated layer was present in the interface between the diamond films, which was assumed to be about 2 to 3 $\mu$m in thickness according to observation by an electron microscope. When the surface of the synthetic diamond film was polished and the heat conductivity in the synthesis direction was measured, it was in a large dispersion depending on the measurement position and only a heat conductivity of 5 W/cm·K was obtained. The dispersion of this measuremnt was assumed to be due to the thickness of the deteriorated layer and in particular, a part of the synthesized diamond film just below the heating body was extremely bad.

Comparative Example 2

In an apparatus for the synthesis of diamond shown in FIG. 2, a synthetic experiment was carried out under the same conditions as in Example 1 except adjusting the distance between the heating body and substrate surface to 30 mm in the carburization treatment step of the heating body and adjusting the distance between the heating body and substrate surface to 6 mm in the diamond synthesis step.

The temperature of the substrate surface was already 400 to 500° C. in this carburization treatment step. The synthesized diamond film was not stripped, but interfaces between the substrate and diamond film and between the diamond films were clearly present and according to observation by an electron microscope, a metallic impurity film present in the interface was assumed to be about 1 $\mu$m in thickness. The diamond film was clearly separated by this interface and as far as the observation concerned, substantial crystal grains were discontinuous. It was made clear as a result of elemental analysis that this metallic impurity film was formed of tungsten, as the material of the heating body. There was found no remarkable impurity metal in the synthesized diamond film other than the interface, but two or three layers of the metallic impurities of about 1 $\mu$m in thickness were present in the diamond film of 180 $\mu$m in thickness, which corresponded to 1/90 to 1/60 (atomic ratio) in simple terms of concentration. The substrate was dissolved, the surface of the synthesized diamond film was polished and the heat conductivity in the synthesis direction was then measured to obtain 7 W/cm·K.

Comparative Example 3

A synthetic experiment was carried out under the same conditions as in Example 1 except adjusting the distance between the heating body and substrate surface to 100 mm in the carburization treatment step of the heating body and adjusting the distance between the heating body and substrate surface to 60 mm in the diamond synthesis step. However, the temperature of the substrate surface during the diamond synthesis step was at most 500° C. and in spite of the repeated experiments three times, the film thickness did not reach 10 $\mu$m, by which the quality as diamond was not satisfied.

Advantages of the Present Invention

According to the present invention, metallic contamination from a heating body can largely be reduced to obtain synthetic diamond having a high bonding strength as well as high heat conductivity. Since such a diamond film that diamond crystal grains are not separated over the whole surface can be formed, while a deteriorated layer in the interface between synthetic diamond films by the repeated synthesis can be diminished or if any, the deteriorated layer is not uniform nor thick to such an extent that it covers completely the whole surface, according to the present invention, in particular, there can be obtained a high quality diamond with at least 100 $\mu$m thickness.

In addition, the synthesis cost can be decreased by synthesizing diamond using a synthesis apparatus whereby the process of the present invention is rendered feasible by an outside operation and continuously carrying out the steps of the carburization treatment of a heating body and the synthesis of diamond.

The synthetic diamond film obtained by such a synthesis apparatus and synthesis process, in particular, such a high quality synthetic diamond film that the concentration of a deteriorated layer formed of other materials than diamond is at most 1/100 in the whole diamond film can be used as a radiation plate with a high heat conductivity.

What is claimed is:

1. A process for the synthesis of diamond comprising pre-heating mixed gases of a hydrocarbon and hydrogen by a heated metal body, carburizing a surface of the metal body, and feeding the heated mixed gases to a heated substrate surface to deposit diamond thereon, wherein the distance between the metal body and substrate surface is at least 50 mm which is sufficient to prevent adhesion of metal to the substrate surface in the carburizing step, and the distance between the metal body and substrate surface is thereafter reduced to 4 to 30 mm to synthesize the diamond.

2. A process for the synthesis of diamond comprising pre-heating mixed gases of a hydrocarbon and hydrogen by a heated metal body, carburizing a surface of the metal body, and feeding the heated mixed gases to a heated substrate surface to deposit diamond thereon, wherein a shield is provided between the metal body and substrate surface in the carburizing step, and the shield is thereafter at least partially removed to synthesize the diamond.

3. A process for the synthesis of diamond comprising pre-heating mixed gases of a hydrocarbon and hydrogen by a heated metal body, carburizing a surface of the metal body, and feeding the heated mixed gases to a heated substrate surface to deposit diamond thereon, wherein a non-reactive gas flow at a speed of at least 5 cm/sec is conducted over the substrate surface or between the metal body and substrate surface in the carburizing step, and the gas flow is thereafter stopped or reduced in speed to synthesize the diamond.

4. A process for the synthesis of diamond comprising pre-heating mixed gases of a hydrocarbon and hydrogen by a heated metal body, carburizing a surface of the metal body, and feeding the heated mixed gases to a heated substrate surface to deposit diamond thereon, wherein the temperature of the metal body is 1500 to lower than 2000° C. in the carburizing step, and the temperature of the metal body is thereafter adjusted to 2100 to 2400° C. to synthesize the diamond.

* * * * *